United States Patent [19]
Kurle et al.

[11] Patent Number: 6,030,850
[45] Date of Patent: Feb. 29, 2000

[54] METHOD FOR MANUFACTURING A SENSOR

[75] Inventors: Juergen Kurle, Reutlingen; Karsten Funk; Franz Laermer, both of Stuttgart; Michael Offenberg, Tuebingen; Andrea Schilp, Schwaebisch Gmuend, all of Germany

[73] Assignee: Robert Bosch GmbH, Stuttgart, Germany

[21] Appl. No.: 09/030,414

[22] Filed: Feb. 25, 1998

Related U.S. Application Data

[62] Division of application No. 08/718,603, Sep. 24, 1996, Pat. No. 5,756,901.

[30] Foreign Application Priority Data

Oct. 11, 1995 [DE] Germany .............................. 195 37 814

[51] Int. Cl.[7] .............................. G01L 1/00; H01L 21/461
[52] U.S. Cl. .............................. 438/48; 73/777; 73/14.01; 73/514.35; 73/514.32; 361/280
[58] Field of Search .............................. 438/48; 257/417, 257/418, 415; 73/777; 361/280

[56] References Cited

U.S. PATENT DOCUMENTS

| | | |
|---|---|---|
| 4,432,007 | 2/1984 | Cady . |
| 5,095,401 | 3/1992 | Zavracky et al. . |
| 5,324,678 | 6/1994 | Kusunoki . |
| 5,324,980 | 6/1994 | Kusunoki . |
| 5,337,606 | 8/1994 | Bennett et al. . |
| 5,343,064 | 8/1994 | Spangler et al. . |
| 5,365,790 | 11/1994 | Chen et al. . |
| 5,395,481 | 3/1995 | McCarthy . |
| 5,545,912 | 8/1996 | Ristic et al. . |
| 5,550,090 | 8/1996 | Ristic et al. . |

FOREIGN PATENT DOCUMENTS 43 18 466  12/1994  Germany .

*Primary Examiner*—Charles Bowers
*Assistant Examiner*—David S Blum
*Attorney, Agent, or Firm*—Kenyon & Kenyon

[57] ABSTRACT

In a sensor and a method for manufacturing a sensor, a movable element is patterned out of a silicon layer and is secured to a substrate. The conducting layer is subdivided into various regions, which are electrically insulated from one another. The electrical connection between the various regions of the silicon layer is established by a conducting layer, which is arranged between a first and a second insulating layer.

4 Claims, 5 Drawing Sheets

METHOD FOR MANUFACTURING A SENSOR

This application is a division of prior application No. 08/718,603 filed Sep. 24, 1996, now U.S. Pat. No. 5,756,901.

BACKGROUND INFORMATION

A sensor and a method for manufacturing a sensor are described in German Patent Application No. 43 18 466, where a substrate is provided with a silicon layer. A movable element for the sensor is patterned out of the silicon layer.

SUMMARY OF THE INVENTION

An advantage of the sensor according to the present invention and of the method according to the present invention is that an especially advantageous contacting of the sensor elements can be ensured through the conducting layer. The conducting layer is insulated by an especially high-grade dielectric insulation from an undesired electrical contact with the silicon layer.

Because of the adapted thermal expansion, silicon is especially suited as a substrate material, because it makes it possible to avoid thermally produced strains, which can affect the characteristic of the sensor. A complete dielectric insulation of the printed conductors from the environment can be effected by using a first and second insulating layer. The movable element can then be completely surrounded by a frame, so that a good separation can be achieved between the region in which the movable element is arranged and contact regions. The movable element can then be hermetically separated by a cover from the environment. When the movable element is displaceable in response to an acceleration, the sensor element can be used as an acceleration sensor. A large useful signal can then be attained when a plurality of fixed and movable electrodes are used. The ability to measure the sensor signal is improved through the symmetrical arrangement of these electrodes. The method according to the present invention makes it possible to simply manufacture a sensor element, only process steps being used, which are well known from semiconductor technology. Furthermore, the method according to the present invention requires only few lithographic steps.

DETAILED DESCRIPTION

Figure 1:
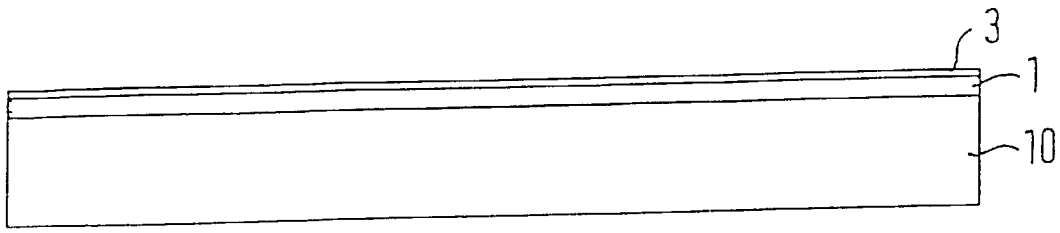
FIGS. 1 through 8 illustrate the various steps of the manufacturing method according to the present invention.

FIG. 1 depicts a silicon substrate (10), on which is deposited a first insulating layer (1) and thereupon, a conducting layer (3). The first insulating layer (1) is a thermal oxide having a thickness of about 2.5 micrometers, and a conducting layer (3) deposited thereon of polysilicon has a thickness of about 0.5 micrometers. However, other layer materials are also conceivable, e.g., insulating layer (1) can also consist of other oxides, silicon nitride, or other insulating layers. Besides polysilicon, metallic layers are also suitable for conducting layer (3), materials, such as tungsten, being selected which are not critical for the subsequent high-temperature steps. The conducting layer (3), which consists here of polysilicon, is doped by means of doping out of the gas phase ($POCl_3$), the aim being to achieve a greatest possible conductivity. All other processes for producing an amply doped polysilicon layer may be used as well.

Figure 2:
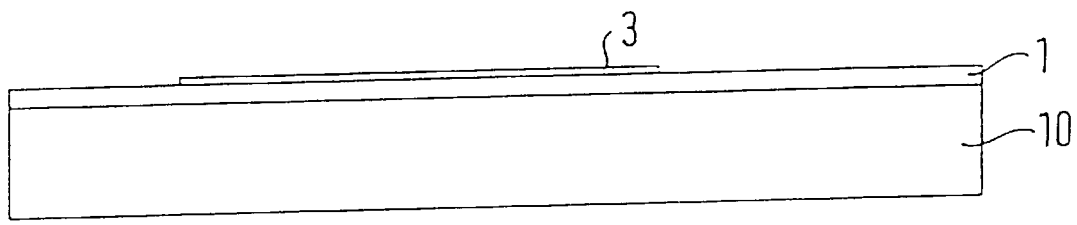

A patterning of conducting layer (3), as shown in FIG. 2, then follows through a photolithographic process. The conducting layer (3) is thereby subdivided into individual regions, which are insulated from one another and can be used, e.g., as printed conductors or electrodes.

A second insulating layer (2) is deposited on the substrate according to FIG. 2. To deposit this layer, the deposition processes known from semiconductor technology for depositing dielectric layers can be used. Thus, besides silicon dioxide, silicon nitride, different glasses or other ceramic layers can also be deposited. For the further description, one will start out from the assumption that the first dielectric layer (1) consists of silicon oxide, which is formed from the thermal oxidation of the silicon substrate (10). The second dielectric layer (2) likewise consists of silicon oxide, which is produced, however, from the gas phase, e.g., through decomposition of silane.

One should note in this case that the thermal silicon oxide layer (1) has a greater density than the silicon oxide layer (2) deposited out of the gas phase. Given a chemical etching of the two layers, this leads to the upper silicon oxide layer (2) etching more quickly than the bottom silicon oxide layer (1). The top insulating layer (2) is then patterned in a photolithographic process, contact holes (4) being introduced into the upper insulating layer (2) to allow contacting of the underlying conducting layer (3). When printed conductors are patterned out of conducting layer (3), they can be contacted through contact holes (4).

Figure 3:
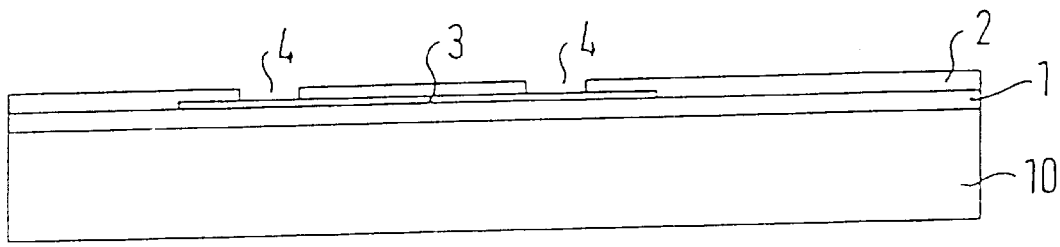
Figure 4:
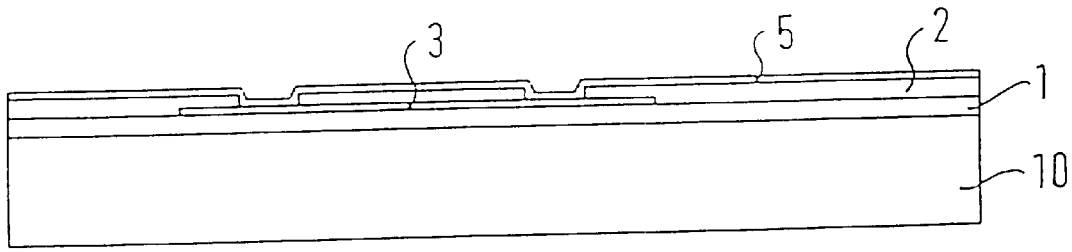
Figure 5:
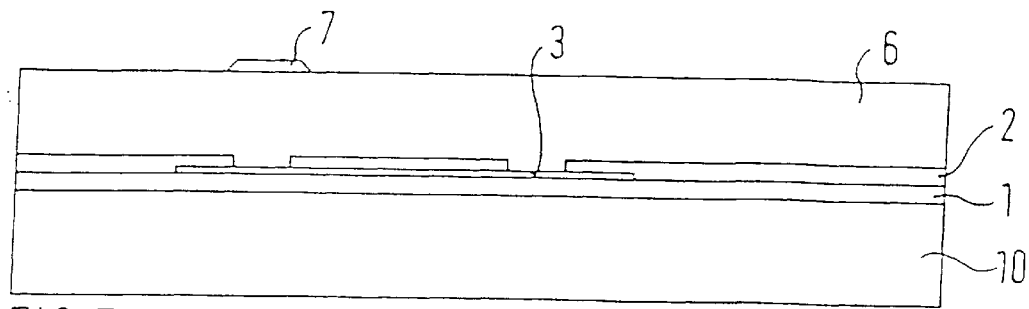
Figure 6:
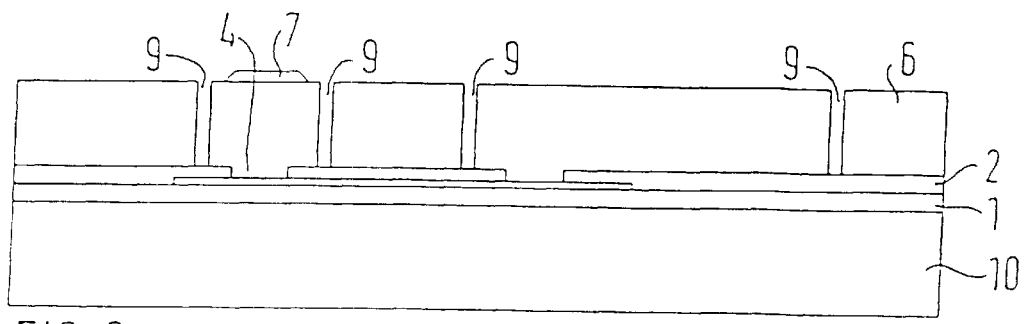

A polysilicon layer (5) is then deposited onto the surface of the substrate according to FIG. 3. The polysilicon starting layer (5) covers the surface of the second insulating layer (2) and serves as a nucleus for the subsequent deposition. A suitable doping process, e.g. implantation or driving in dopants out of the gas phase, is used to ensure that the polysilicon starting layer (5) is heavily doped. All customary methods used in semiconductor technology for depositing polysilicon layers on to dielectric layers are suitable for depositing the polysilicon starting layer.

The thick silicon layer is then deposited in a further process step. This deposition takes place in an epitaxial reactor. An epitaxial reactor of this type is a system for depositing silicon layers, which are used in semiconductor technology for producing monocrystalline silicon layers on a monocrystalline silicon substrate. The deposition of layers of this type takes place, as a rule, at temperatures of more than 1000 degrees celsius and, thus, layers in the order of magnitude of a few 10 micrometers can be attained.

Since in the present process, the deposition in the epitaxial reactor does not take place on a monocrystalline silicon substrate, but rather on the polycrystalline silicon starting layer, no monocrystalline silicon forms, but rather a thick polycrystalline silicon layer (6), which is referred to in the following as a thick Si-layer (6). The crystalline properties of the thick silicon layer (6) are able to be influenced by the deposition conditions under which the polycrystalline silicon starting layer (5) is produced. In addition, the heavy doping of the polysilicon starting layer (5) effects a doping of the thick silicon layer (6) starting from the bottom side. Furthermore, during the time that the thick silicon layer (6) grows and in a subsequent doping process, a further doping of the thick silicon layer (6) takes place. The subsequent doping of the thick silicon layer (6) can follow, in turn, by means of implantation, doping out of the gas phase or by means of any other doping process known from semiconductor technology. In this process, the polysilicon starting layer (5) becomes a part of the thick layer (6). In the area of contact holes (4), the thick layer (6) has a direct contact with conducting layer (3).

A patterned metal layer (7) is then still applied to the top side of thick layer (6). The metal layer can be applied, e.g., over the entire surface and subsequently patterned.

A patterning of the thick Si-layer (6), as shown in FIG. (6), then follows in a further photolithographic process. For this purpose, a mask, e.g. a photomask, is applied to the top side of layer (6) and also protects metal layer (7) in the subsequent etching process. A dry-etching (plasma etching), for example, of the thick Si-layer (6) then follows through openings in the photoresist mask, trenches (9) being introduced thereby. Trenches (9) having a high aspect ratio, i.e., a substantial depth and small lateral dimensions, can then be produced through a plasma etching process.

Following the deposition, the thick Si-layer (6) initially has a relatively rough surface. A photo-resist is applied to planarize this surface roughness, and an etching process follows, e.g., in an $SF_6/O_2$ plasma, which etches resist and polysilicon at the same etching rate. The photoresist is first applied in a liquid state and forms a flat surface, so that the surface roughness of the layer (6) is diminished.

The trenches (9) extend from the top side of the thick Si-layer (6) down to the second insulating layer (2). The layer (6) is subdivided into individual regions, which are isolated from another, to the extent that they are not interconnected via conducting layer (3).

Figure 7:
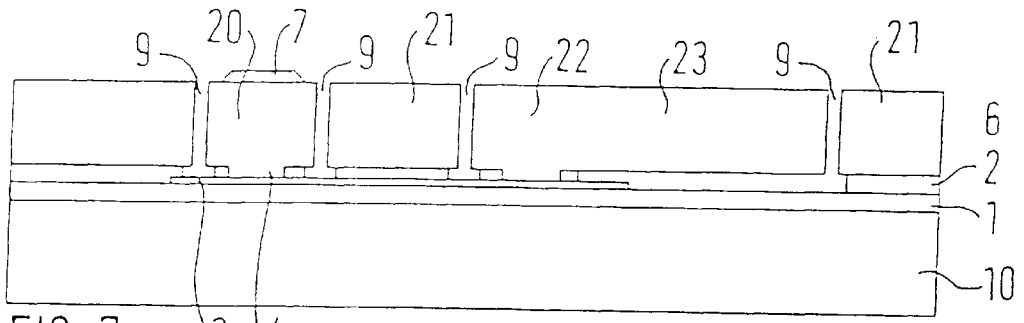

An etching medium is then introduced to the second insulating layer (2) through trenches (9), the etching medium effecting an etching of the electrical layer (2). The insulating layer (2) is then etched starting from trenches (9), an etching not only taking place directly under trenches (9), but a lateral undercut-etching also taking place under layer (6) in dependence upon the etching duration, as shown in FIG. 7. The undercut-etching underneath silicon layer (6) will be described in greater detail with respect to FIG. 9. FIG. 7 illustrates the state that exists following the etching of the insulating layer (2). Of course, insulating layer (1) is also attacked, however minimally, due to the greater density of the material and the short etching duration. However, to the extent that it is desired for the functioning of the manufactured sensor element, an etching of the lower insulating layer (1) can follow as the result of a longer etching duration.

FIG. 7 now shows an exemplary cross-section through a sensor element. Different functional regions are now patterned out of layer (6). A connection (terminal) region (20), which is completely surrounded by trenches (9), is patterned out from underneath the metallization. This connection region (20) is, thus, completely isolated by trenches (9) from the rest of layer (6). However, since connection region (20) is in direct contact with conducting layer (3), a contact to other regions of layer (6) can be established through conducting layer (3), which is then designed in this case as a printed conductor.

The purpose of connection region (20) with its applied metallization (7) is to secure bonding wires, which are used to establish an electrical contact to the sensor structure. The conducting layer (3), which is designed as a printed conductor, permits an electrical connection between connection region (20) and an anchoring region (22). The anchoring region (22) is likewise built up on conducting layer (3) and is in electrical contact with conducting layer (3). In addition, as a result of this connection, the anchoring region (22) is permanently anchored to the substrate.

The anchoring region (22) goes over to changes into a free-standing region (23). The free-standing region (23) is characterized by the removal of insulating layer (2) underneath free-standing region (23). Therefore, free-standing region (23) can be moved toward the substrate (10).

In addition, a frame (21), which is likewise completely surrounded by trenches (9), is shown in FIG. 7. The trenches (9) isolate frame (21) from the other regions of the Si-layer (6). In addition, frame (21) is constructed on the insulating layer and is, thus, insulated from conducting layer (3) shown in FIG. 7.

Figure 8:
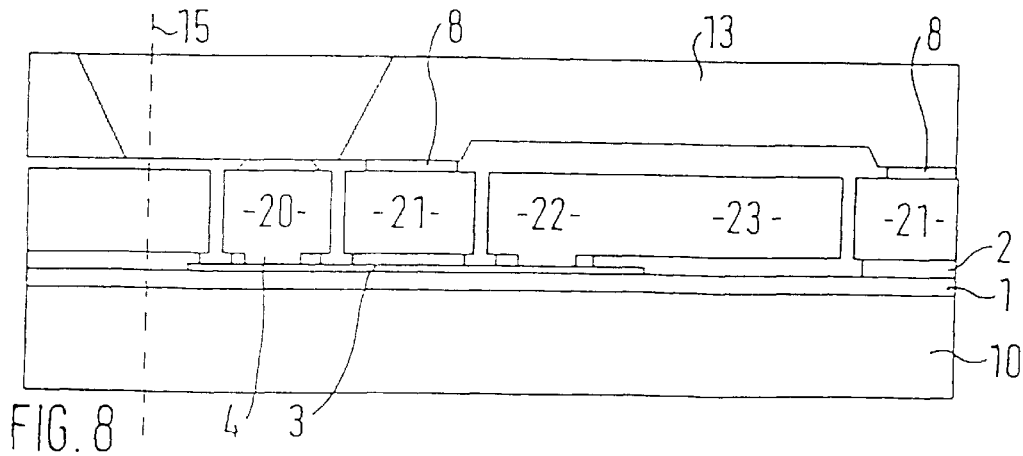

The functioning of frame (21) is elucidated in FIG. 8. In the further course of the manufacturing process, a cover (13), which hermetically seals the sensor, is secured to frame (21). Thus, a hermetically tight sealing of the sensor element is achieved. To establish the connection between frame (21) and cover (13), solder glass layer (8) is reflow-soldered on. The solder glass layer can then be deposited, e.g., by means of silk-screen printing on to the cover. When not just one sensor element, but instead several sensor elements are fabricated concurrently on substrate (10), then a cover plate (14) with a plurality of corresponding covers (13) can be provided. The substrate plate (10) having the plurality of sensor elements and the cover plate having the plurality of corresponding covers (13) are then joined together, and the individual sensor elements are diced into individual sensors along dicing lines (15). The costs for each individual sensor element are kept low by manufacturing several sensors concurrently.

Figure 9:
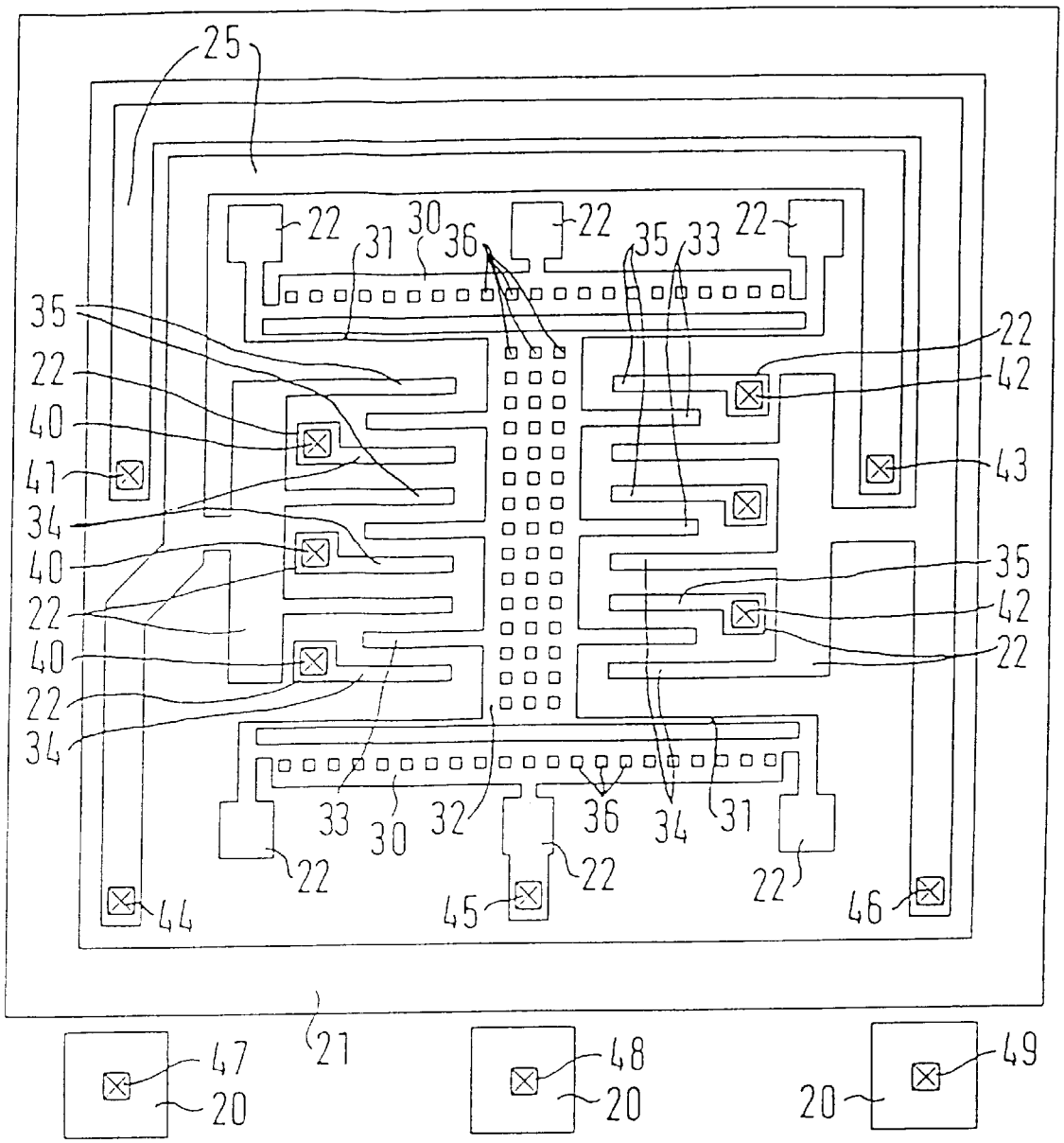
FIG. 9 shows a view of the silicon layer of an acceleration sensor.

FIG. 9 illustrates a plan view of an acceleration sensor, which is fabricated according to the method of FIGS. 1 through 8. For the sake of clarity, three electrode sets are shown as examples. In an actual component, the number can be clearly higher. The plan view of FIG. 9 thereby corresponds to a plan view of the structure, as it appears in the top view according to the manufacturing steps of FIGS. 6 and 7, metal layer (7) not being shown, however, for the sake of simplicity. Thus, the plan view of Figure (9) corresponds to a plan view of the patterned, thick silicon layer (6). However, FIGS. 6 and 7 do not represent a cross-section through the structure shown in FIG. 9, but rather merely a simplified illustration of all essential elements, as they are depicted in the case of the acceleration sensor of FIG. 9.

As FIG. 9 reveals, frame (21) is designed as a square frame, which completely surrounds one region. The acceleration-sensitive element is arranged inside the frame, the acceleration-sensitive element having regions which are permanently joined to the substrate, and regions which are detached from the substrate. Permanently joined to the substrate are the anchoring regions (22) and the connecting elements (25). Separated from the substrate are pressure bar (30), flexural elements (31), seismic mass (32), movable electrodes (33), and fixed electrodes 34, 35). The undercut-etching underneath layer (6) takes place during fabrication in a time-limited etching step. The etching is limited in time so as to undercut structures having a small lateral extent, while structures having a large lateral extent are not undercut.

The anchoring regions (22) and connecting elements (25) each have large lateral dimensions, so that the insulating layers 1, 2 situated underneath these structures are not completely undercut. The flexural elements, the movable electrodes, and the fixed electrodes have only small lateral dimensions, so that the insulating layers under these structures are quickly undercut. The seismic mass (32) and pressure bars (30) are, in fact, designed to be relatively large, however, they have a plurality of etching holes (36), so that pressure bars (30) and seismic mass (32) only have small lateral dimensions. The etching holes (36) each extend from the top side of Si-layer (6) to the bottom side of the thick silicon layer (6) and, thus, allow unhindered access of a medium to subjacent insulating layers 1, 2, which serve as sacrificial layers.

The limitations with respect to the lateral dimensions do not apply to contact holes, as denoted by reference numeral 4 in FIG. 7 or reference numerals 40 through 49 in FIG. 9, since in the case of these contact holes, Si-layer 6 is directly connected to conducting layer 3. In this case, there cannot be any undercutting underneath layer 2, so that given large enough lateral dimensions of conducting layer 3 in this region, structures with very small lateral dimensions can also be realized in the thick Si-layer 6 situated above it. The lateral dimensions in the conducting layer 3 can thereby be correspondingly smaller, because the bottom insulating layer 1 is not as etchable.

To represent the electrical interconnections of the individual sensor components, contact holes (40 through 49) are also shown in FIG. 9, but are not visible in the plan view of the layer (6). The contact holes of FIG. 9 are once again shown separately in FIG. 10, and the interconnection of the contact holes, which is established by the conducting layer (3), is shown. As FIG. 9 reveals, each movable electrode (33) is arranged between two fixed electrodes. The fixed electrodes (34) are each arranged in the negative Y-direction and the fixed electrodes (35) in the positive Y-direction of the corresponding movable electrode (33). Three contact holes (40) are shown in FIG. 9, through which an electrical contact to three fixed electrodes (34) is established on the left side of the sensor element shown in FIG. 9.

Figure 10:
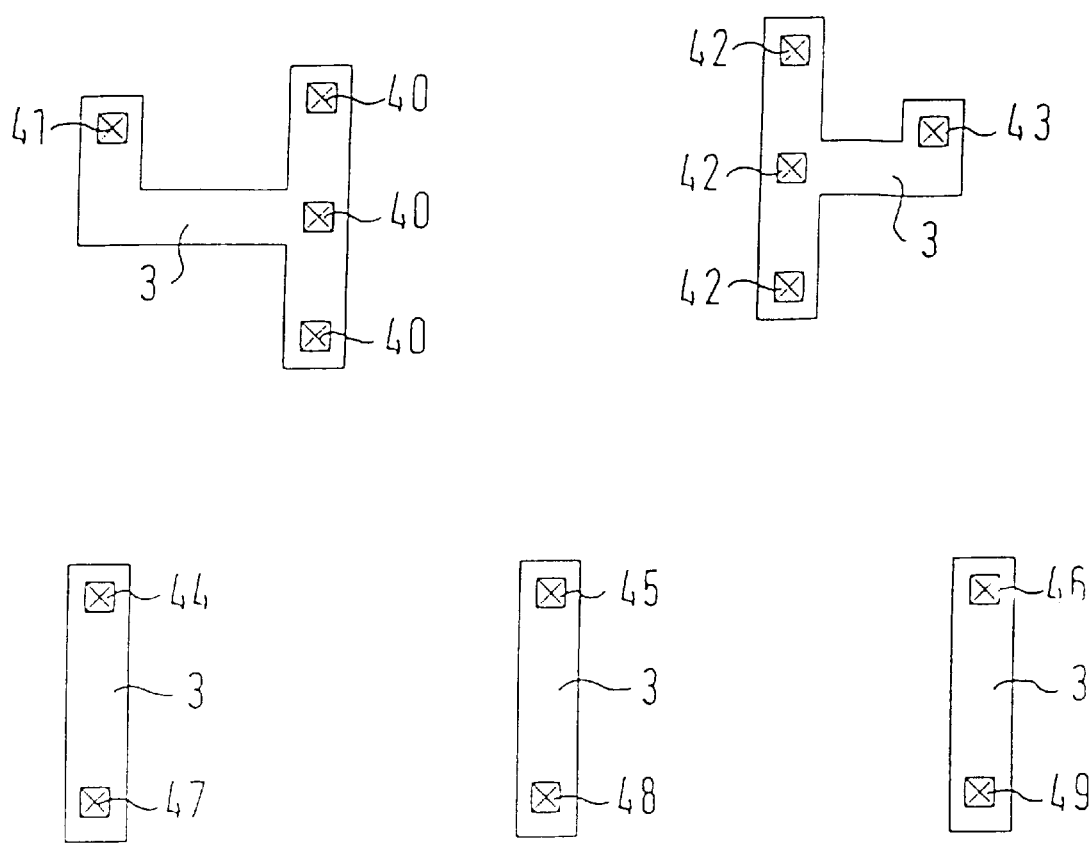
FIG. 10 shows the arrangement of the conducting layer of the sensor according to FIG. 9.

As FIG. 10 reveals, the contact holes (40) are connected through the conducting layer (3), which is patterned as a printed conductor, to one another and to another contact hole (41). The contact hole (41) establishes a contact to a connecting element (25), which establishes an electrical connection between the left side of the sensor element and the right side of the sensor element. On the right side, this connecting element (25) is then likewise electrically connected to the fixed electrodes (34) and to another contact hole (46). As shown in FIG. 10, the contact hole (46) is connected through the conducting layer (3) patterned as a printed conductor to another contact hole (49), which establishes the electrical contact to a connection region (20) situated outside of frame (21). Thus, an electrical contact is established to all fixed electrodes (34) through this connection region (20), so that a capacitive signal can be tapped off from these electrodes.

Provided, accordingly, on the right side of the sensor element are contact holes (42), which are connected through a printed conductor to a contact hole (43). The contact holes (42) establish, in turn, a contact to fixed electrodes (35). By way of a connecting element (25), a contact is then established to the fixed electrode (35) situated on the left side and to a contact hole (44). As FIG. 10 reveals, through contact hole (44) and the printed conductor patterned out of conducting layer (3), a contact to a contact hole (47) and to a corresponding connection region is established. Thus, the signal from the fixed electrodes (35) can be measured at this connection region. An electrical contact to movable electrodes (33) is established through the contact hole (45) via pressure bar (30), flexural elements (31), and seismic mass (32). The contact hole (45) is connected through a printed conductor formed out of conducting layer (3) to a contact hole (48) and to a corresponding connecting region (20) where the capacitive signal of the movable electrodes is, thus, able to be tapped off.

When an acceleration occurs in the positive or negative Y-direction, then seismic mass (32) and movable electrodes (33) suspended thereon are shifted in the positive or negative Y-direction, since this structure is only suspended on thin flexural elements (31). Because of their thin form, these flexural elements are able to be easily deformed in the Y-direction. The deflection changes the distance of movable electrodes (33) relative to fixed electrodes (34) and (35) changes. Thus, the deflection can be verified by measuring the capacitance between the fixed and movable electrodes.

FIG. 9 shows a plan view of Si-layer (6), metallization (7) not being depicted. A metal layer (7), which permits a bonding wire to be attached, is provided on each connection region (20). A solder glass layer (8), which permits a cover (13) to be attached, is provided on frame (21).

As revealed in the cross-section through FIG. 7, frame (21) is completely isolated from the printed conductors formed from conducting layer (3). In addition, as revealed in FIG. 10, the individual printed conductors formed out of conducting layer (3) are isolated from one another.

The pressure bar (30) is detached from the substrate and can expand or contract in relation to the substrate. As a result, thermally produced stresses and/or stresses which arise in the process of fabricating the thick Si-layer (6), do not have any effect on the stress state of flexural elements (31). These stresses are compensated by the parallel arranged pressure bar (30).

The thickness of the first and second insulating layer 1, 2 lies in the order of magnitude of a few micrometers; the layer of conducting layer (3), as a rule, under one micrometer; and the thickness of silicon layer (6) amounts to an order of magnitude of a few 10 micrometers. Since conducting layer (3) and layer (6) are separated in some regions, e.g., underneath frame (21), only by the second insulating layer (2), which is a few micrometers thick, comparatively large parasitic capacitances occur. Therefore, the design of the sensor shown in FIG. 9 is so selected that the capacitances for both groups of fixed electrodes (34) and (35) are more or less equal. Furthermore, as a rule, conducting layer (3) has a comparatively poorer conductivity than the thick Si-layer (6). Therefore, the design is selected so that of the six fixed electrodes (34) in the first group, three are linked through a conducting layer (3) and three other electrodes through layer (6). This applies correspondingly to a second group of fixed electrodes (35). Therefore, the parasitic lead resistances to the individual electrodes are more or less the same for both groups of fixed electrodes (34, 35).

Figure 11:
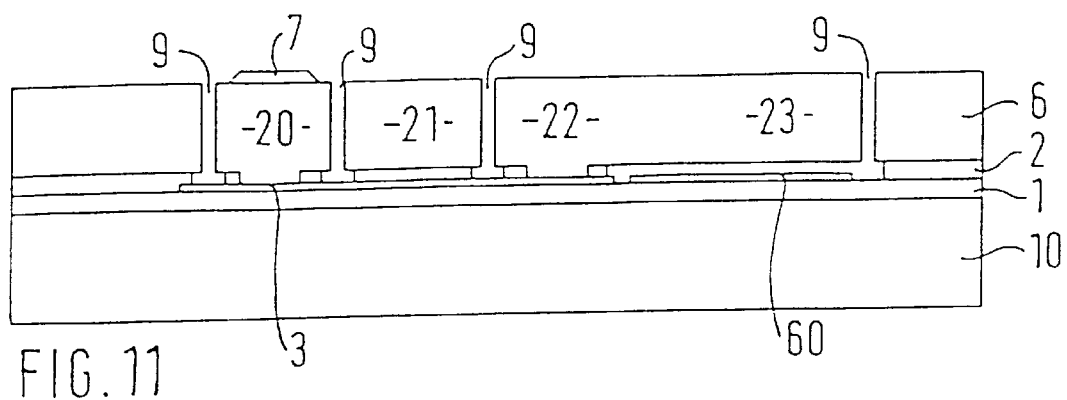
FIG. 11 shows another exemplary embodiment of the sensor.

FIG. 11 shows another example of a sensor according to the present invention, the cross-section through FIG. 11 essentially corresponding to the cross-section through FIG. 7, the identical reference numerals of FIG. 11 denoting the same objects as the corresponding reference numerals of FIG. 7. However, in contrast to FIG. 7, a vertical electrode (60), which is likewise patterned on conducting layer (3), is provided underneath the etched-free region (23). By means of the vertical electrode, for example, movements of the etched-free region (23) can be verified in a direction normal to the substrate. Furthermore, a vertical electrode (60) of this type can be used as a shield electrode, which shields the actual sensor structure from environmental influences.

Figure 12:
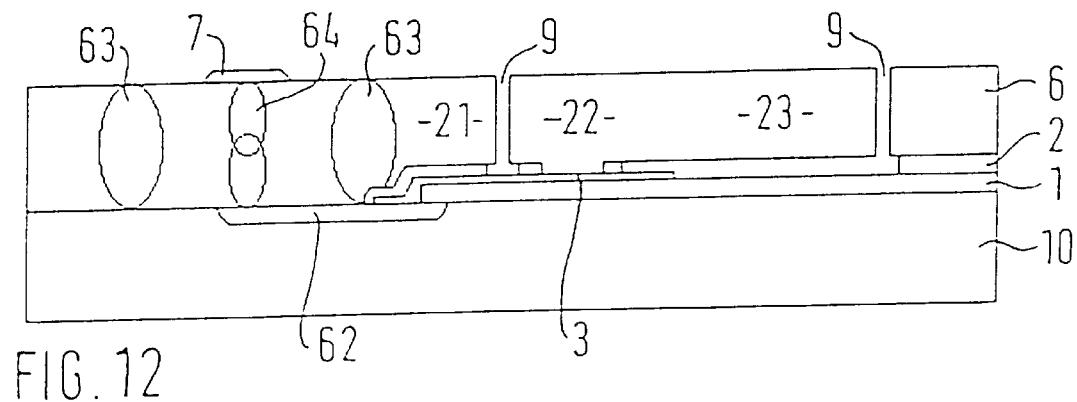
FIG. 12 shows yet another exemplary embodiment of the sensor.

A cross-section through another exemplary embodiment of a sensor is shown in FIG. 12, this cross-section corresponding, in turn, to FIG. 7. The same objects are again denoted by identical reference numerals. However, in contrast to FIG. 7, no connection region (20), which is isolated by trenches (9) from layer (6), is provided. The electrical contacting follows in that two connection diffusions (64), which extend to a buried layer (62), are provided underneath metallization (7). The buried layer (62) is then connected to conducting layer (3) formed as a printed conductor. The insulation from the rest of conducting layer (6) is achieved in this case by insulating diffusions (63). The substrate underneath the insulating diffusions is thereby p-doped. The Si-layer (6), connection diffusions (64), and buried layer (62) are then n-doped. This structure can be used quite advantageously, when the intention is to integrate a circuit together with the sensor element.

What is claimed is:

1. A method for manufacturing a sensor, comprising the steps of:

sequentially depositing on a substrate, a first insulating layer, a conducting layer directly in contact with said first insulating layer, a second insulating layer directly in contact with said conducting layer, and a silicon layer directly in contact with said second insulating layer;

patterning the conducting layer and the second insulating layer before deposition of a subsequent layer;

introducing trenches into the silicon layer, the trenches extending from a top side of the silicon layer to the second insulating layer; and applying an etching medium through the trenches to the second insulating layer.

2. The method according to claim 1, wherein the substrate is a silicon substrate.

3. The method according to claim 1, wherein the first and second insulating layers include silicon oxide.

4. The method according to claim 1, wherein the silicon layer is deposited in an epitaxial reactor.

* * * * *